United States Patent
Yuyama et al.

(10) Patent No.: US 11,029,358 B2
(45) Date of Patent: *Jun. 8, 2021

(54) NOISE SOURCE MONITORING APPARATUS AND NOISE SOURCE MONITORING METHOD

(71) Applicant: FANUC CORPORATION, Yamanashi (JP)

(72) Inventors: Makine Yuyama, Yamanashi-ken (JP); Tetsuro Matsudaira, Yamanashi-ken (JP)

(73) Assignee: FANUC CORPORATION, Yamanashi (JP)

(*) Notice: Subject to any disclaimer, the term of this patent is extended or adjusted under 35 U.S.C. 154(b) by 141 days.

This patent is subject to a terminal disclaimer.

(21) Appl. No.: 16/504,687

(22) Filed: Jul. 8, 2019

(65) Prior Publication Data

US 2020/0018793 A1    Jan. 16, 2020

(30) Foreign Application Priority Data

Jul. 12, 2018  (JP) .............................. JP2018-132439
May 8, 2019   (JP) .............................. JP2019-088466

(51) Int. Cl.
*G06K 9/00*     (2006.01)
*G01R 31/317*  (2006.01)
*G06F 3/14*     (2006.01)

(52) U.S. Cl.
CPC ..... *G01R 31/31708* (2013.01); *G06K 9/0057* (2013.01); *G06K 9/00771* (2013.01); *G06F 3/14* (2013.01)

(58) Field of Classification Search
CPC ........... G01R 31/31708; G06K 9/0057; G06K 9/00771; G06K 9/00503; G06F 3/14; G06F 3/147; G09G 2370/20; G09G 2340/12; G05B 23/0213; G05B 2219/24065

See application file for complete search history.

(56) References Cited

U.S. PATENT DOCUMENTS 5,218,620 A * 6/1993 Mori .................... H04B 1/707
                                                                375/142
2017/0185056 A1* 6/2017 Satou .................. G05B 13/027

FOREIGN PATENT DOCUMENTS

| JP | 2000276222 A | 10/2000 |
|----|--------------|---------|
| JP | 2004005639 A | 1/2004  |
| JP | 2007183171 A | 7/2007  |
| JP | 2008165453 A | 7/2008  |
| JP | 2013117812 A | 6/2013  |

* cited by examiner

*Primary Examiner* — Siamak Harandi
(74) *Attorney, Agent, or Firm* — Robert P. Michal, Esq.; Carter, DeLuca & Farrell LLP

(57) ABSTRACT

A noise source monitoring apparatus includes: a first storage unit storing captured image data; a second storage unit storing observed waveform data; a processing unit calculating, for each of the switch units, the degree of correlation between occurrence of a noise and operation of the switch unit, based on the captured image data and the observed waveform data; and a display control unit causing a display unit to display information indicating the degree of correlation.

15 Claims, 9 Drawing Sheets

FIG. 3A

|  | 1ST SWITCH UNIT | 2ND SWITCH UNIT | 3RD SWITCH UNIT | 4TH SWITCH UNIT | 5TH SWITCH UNIT |
|---|---|---|---|---|---|
| 1ST TIME PERIOD | NONE | NONE | NONE | NONE | NONE |
| 2ND TIME PERIOD | NONE | PRESENT | NONE | NONE | NONE |
| 3RD TIME PERIOD | NONE | NONE | NONE | NONE | PRESENT |
| 4TH TIME PERIOD | NONE | PRESENT | NONE | NONE | NONE |
| 5TH TIME PERIOD | NONE | NONE | NONE | NONE | PRESENT |
| 6TH TIME PERIOD | PRESENT | NONE | NONE | NONE | NONE |
| 7TH TIME PERIOD | NONE | NONE | NONE | NONE | PRESENT |
| 8TH TIME PERIOD | NONE | NONE | NONE | NONE | PRESENT |
| 9TH TIME PERIOD | NONE | PRESENT | NONE | NONE | NONE |
| 10TH TIME PERIOD | NONE | NONE | NONE | NONE | PRESENT |

FIG. 3B

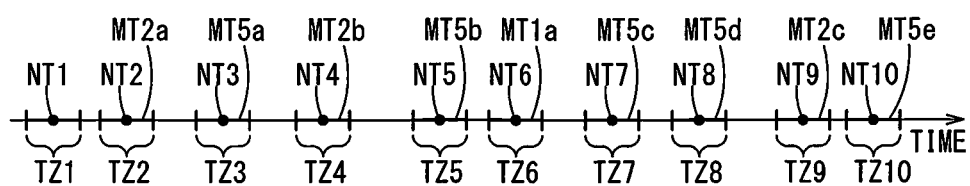

28a 28b 28c 28d 28e

32

NOISE SOURCE MONITORING APPARATUS AND NOISE SOURCE MONITORING METHOD

CROSS-REFERENCE TO RELATED APPLICATION

This application is based upon and claims the benefit of priority from Japanese Patent Applications No. 2018-132439 filed on Jul. 12, 2018 and No. 2019-088466 filed on May 8, 2019, the contents of which are incorporated herein by reference.

BACKGROUND OF THE INVENTION

Field of the Invention

The present invention relates to a noise source monitoring apparatus and a noise source monitoring method for monitoring noise sources of noise generated in a control device that controls an industrial machine.

Description of the Related Art

Japanese Laid-Open Patent Publication No. 2000-276222 discloses a logging device which images the operation status of a monitoring target facility (manufacturing line, manufacturing equipment, etc.) with a camera to record the captured image data and display the recorded result on a display.

SUMMARY OF THE INVENTION

Incidentally, due to the operation of the above-mentioned monitoring target facility, noise may be emitted from at least one part of the facility and transmitted to, and generated in, a control device that controls industrial machines around the monitoring target facility.

However, the logging device disclosed in Japanese Laid-Open Patent Publication No. 2000-276222 has a problem that it cannot offer the operator any information for estimating the noise source of the noise generated in the control device.

It is therefore an object of the present invention to provide a noise source monitoring apparatus and a noise source monitoring method that provide an operator with information for estimating a noise source of noise generated in a control device.

According to a first aspect of the present invention, a noise source monitoring apparatus includes: a first storage unit configured to store captured image data containing a captured image of a plurality of switch units and a capture time of the captured image, the switch units being configured to switch on and off drive units for driving a plurality of devices, the drive units being arranged around a control device for controlling an industrial machine, the plurality of devices being different from the industrial machine; a second storage unit configured to store observed waveform data containing an observed waveform displayed on an oscilloscope connected to the control device and an observation time of the observed waveform; a processing unit configured to calculate, for each of the switch units, the degree of correlation between occurrence of a noise generated in the control device and operation of the switch unit, based on the captured image data and the observed waveform data; and a display control unit configured to cause a display unit to display information indicating the degree of correlation.

According to a second aspect of the present invention, a noise source monitoring method includes: a step of reading captured image data from a first storage unit storing the captured image data, the captured image data containing a captured image of a plurality of switch units and a capture time of the captured image, the switch units being configured to switch on and off drive units for driving a plurality of devices, the drive units being arranged around a control device for controlling an industrial machine, the plurality of devices being different from the industrial machine; a step of reading observed waveform data from a second storage unit storing the observed waveform data, the observed waveform data containing an observed waveform displayed on an oscilloscope connected to the control device and an observation time of the observed waveform; a correlation calculating step of calculating, for each of the switch units, the degree of correlation between occurrence of a noise generated in the control device and operation of the switch unit, based on the captured image data and the observed waveform data; and a display controlling step of causing a display unit to display information indicating the degree of correlation.

According to the present invention, it is possible to provide an operator with information for estimating a noise source of noise generated in a control device.

The above and other objects, features, and advantages of the present invention will become more apparent from the following description when taken in conjunction with the accompanying drawings in which a preferred embodiment of the present invention is shown by way of illustrative example.

BRIEF DESCRIPTION OF THE DRAWINGS

FIG. 3A is a table showing the presence or absence of operation of each switch unit at each noise event time; FIG. 3B is a diagram showing, on a time axis, ten noise event times, ten time periods, and ten operation times each for an n-th switch unit in a k-th time period;

DESCRIPTION OF THE PREFERRED EMBODIMENTS

The noise source monitoring apparatus and the noise source monitoring method according to the present invention will be detailed by describing preferred embodiments with reference to the accompanying drawings.

Embodiment

Figure 1:
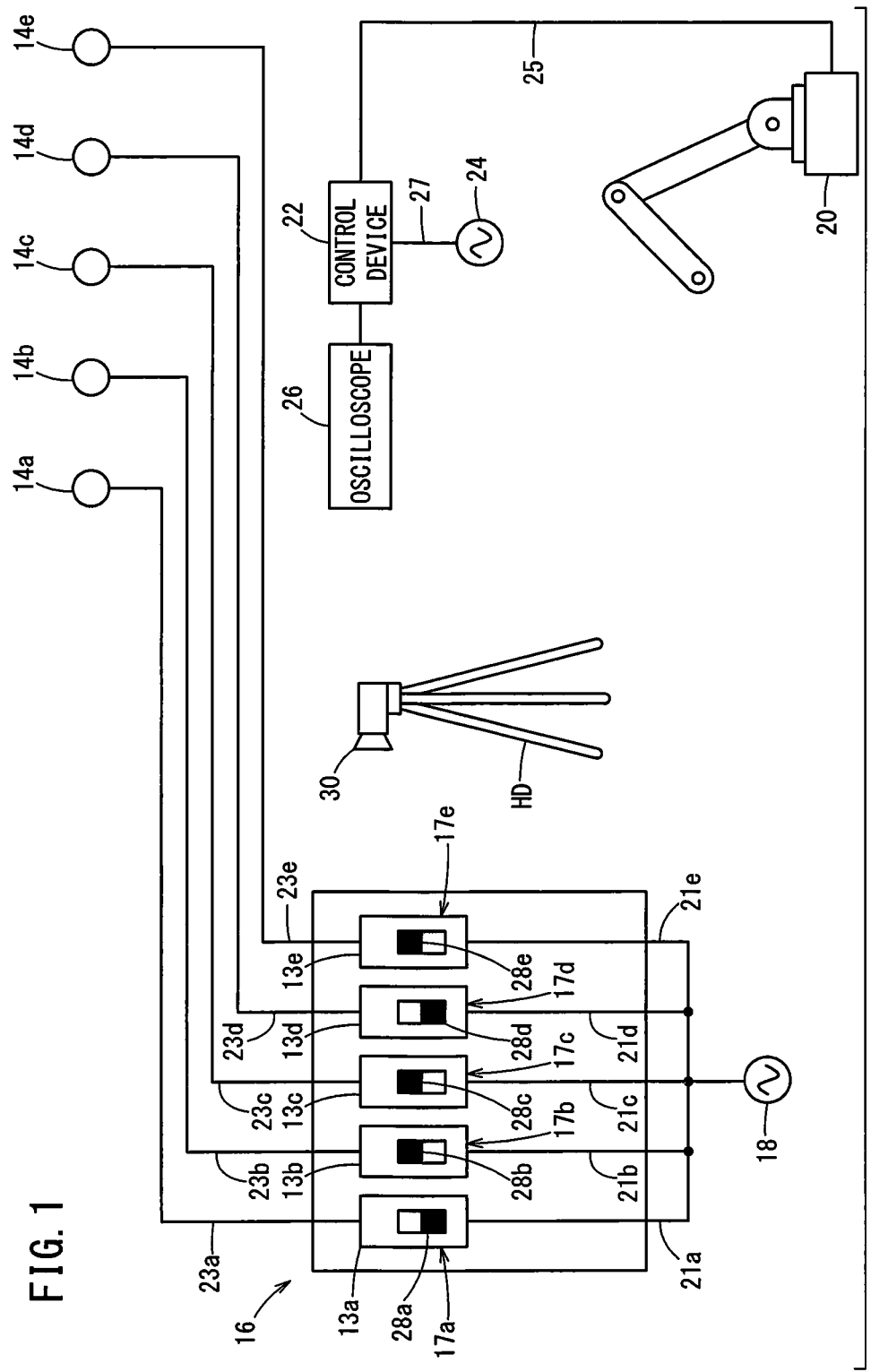
FIG. 1 is a diagram showing a schematic configuration of a monitoring target of a noise source monitoring apparatus and others according to an embodiment of the present invention.

FIG. 1 shows a schematic configuration of a monitoring target of a noise source monitoring apparatus 10 and others, which is an example of the noise source monitoring apparatus of the present invention.

The noise source monitoring apparatus 10 is a device that monitors noise sources which generate noise in a control device 22 for controlling an industrial machine or a robot 20 shown in FIG. 1. Details of the noise source monitoring apparatus 10 will be described later.

There are arranged multiple (for example, five) drive units 14 (first drive unit 14a, second drive unit 14b, third drive unit 14c, fourth drive unit 14d, fifth drive unit 14e) around the robot 20 and the control device 22. Each drive unit 14 is a drive source for an apparatus, such as a conveyor, for example. Each drive unit 14 is connected to a first power supply 18 via a switchboard 16, as needed. Each drive unit 14 may be a motor, a solenoid or the like, in which for example, a coil is incorporated.

The switchboard 16 includes a plurality of (for example, five) switch units 17 that correspond to a plurality of (for example, five) drive units 14, respectively, and each switch connection and disconnection between the corresponding drive unit 14 and the first power supply 18. Here, the switch unit 17 corresponding to the first drive unit 14a is referred to as a first switch unit 17a, the switch unit 17 corresponding to the second drive unit 14b is referred to as a second switch unit 17b, the switch unit 17 corresponding to the third drive unit 14c is referred to as a third switch unit 17c, the switch unit 17 corresponding to the fourth drive unit 14d is referred to as a fourth switch unit 17d, and the switch unit 17 corresponding to the fifth drive unit 14e is referred to as a fifth switch unit 17e.

Each switch unit 17 includes a casing 13, a switch such as a relay, a contactor or the like, housed in the casing 13, and a lever 28 arranged inside a cutout formed on the front wall (the wall on the front in FIG. 1) of the casing 13. The switch has a fixed contact and a moving contact that moves by magnetic force of an electromagnet. The lever 28 moves up and down in the cutout in conjunction with the movement of the moving contact. Here, in the drawing of FIG. 1, the black part in the cutout of each switch unit 17 shows the lever 28. When the lever 28 of each switch unit 17 is located at the upper position in the cutout, the switch corresponding to the lever 28 is on. When the lever 28 of each switch unit 17 is located at the lower position in the cutout, the switch corresponding to the lever 28 is off.

Here, the casing 13 of the first switch unit 17a is named a first casing 13a, the casing 13 of the second switch unit 17b is named a second casing 13b, the casing 13 of the third switch unit 17c is named a third casing 13c, the casing 13 of the fourth switch unit 17d is named a fourth casing 13d, and the casing 13 of the fifth switch unit 17e is named a fifth casing 13e. The switch of the first switch unit 17a is called a first switch, the switch of the second switch unit 17b is called a second switch, the switch of the third switch unit 17c is called a third switch, the switch of the fourth switch unit 17d is called a fourth switch, and the switch of the fifth switch unit 17e is called a fifth switch. The lever 28 of the first switch unit 17a is called a first lever 28a, the lever 28 of the second switch unit 17b is called a second lever 28b, and the lever 28 of the third switch unit 17c is called a third lever 28c, the lever 28 of the fourth switch unit 17d is called a fourth lever 28d, and the lever 28 of the fifth switch unit 17e is called a fifth lever 28e.

One of the fixed and moving contacts in each switch is connected to the first power supply 18 via a power cable 21, and the other is connected to the drive unit 14 via a drive cable 23. Detailedly, one of the fixed and moving contacts of the first switch is connected to the first power supply 18 via a first power cable 21a, and the other is connected to the first drive unit 14a via a first drive cable 23a. One of the fixed and moving contacts of the second switch is connected to the first power supply 18 via a second power cable 21b, and the other is connected to the second drive unit 14b via a second drive cable 23b. One of the fixed and moving contacts of the third switch is connected to the first power supply 18 via a third power cable 21c, and the other is connected to the third drive unit 14c via a third drive cable 23c. One of the fixed and moving contacts of the fourth switch is connected to the first power supply 18 via a fourth power cable 21d, and the other is connected to the fourth drive unit 14d via a fourth drive cable 23d. One of the fixed and moving contacts of the fifth switch is connected to the first power supply 18 via a fifth power cable 21e, and the other is connected to the fifth drive unit 14e via a fifth drive cable 23e.

When each switch unit 17 is off, the drive unit 14 corresponding to the switch unit 17 and the first power supply 18 are disconnected. When each switch unit 17 is turned on from the off state, the drive unit 14 corresponding to the switch unit 17 and the first power supply 18 are brought into conduction.

The timing at which each switch unit 17 is switched between on and off states are determined in advance based on a control program for operating the multiple drive units 14. For example, each switch unit 17 is driven by a PLC (Programmable Logic Controller).

The robot 20 is an industrial robot having multiple movable joints driven by, for example, motors, and is connected to the control device 22 via a control cable 25.

The control device 22 is connected to a second power supply 24 (AC power supply) via a power supply cable 27. The control device 22 includes: a signal generating circuit for generating a control signal in accordance with the control program for operating the robot 20; an unillustrated converter for converting AC current (alternating electric current) from the second power supply 24 into DC current (direct electric current); and a current output circuit that outputs the DC current from the converter, to the motors of the robot 20 at timings according to the control signal. The control device 22 is realized by, for example, a CPU (Central Processing Unit) or a FPGA (Field Programmable Gate Array).

Here, as a connection state (i.e., connecting or disconnecting) between the first power supply 18 and the n-th drive unit 14 (n=1 to 5) changes in accordance with ON or OFF of the n-th switch unit 17 (n=1 to 5), there may occur a case in which a radiation noise arises from at least one of the n-th switch unit 17, the n-th drive unit 14, the n-th drive cable 23 (n=1 to 5) connecting the n-th switch unit 17 and the n-th drive unit 14, and the n-th power cable 21 (n=1 to 5) connecting the n-th switch unit 17 and the first power supply 18. For example, when the n-th switch unit 17 is turned off from the on-state, the surplus energy stored in the coil of the n-th drive unit 14 associated with the n-th switch unit 17 has nowhere to go, so that radiation noise is liable to arise. If this radiation noise is transmitted to the control device 22, the waveform of the control signal is disturbed, and the normal operation of the robot 20 is hindered.

To deal with this, the control device 22 monitors the waveform of the generated control signal, and if the waveform of the control signal is disturbed and the control signal is corrupted by radiation noise so that the normal operation is hindered, the control device decides that there is an error and stops the operation of the robot 20. Not to mention, there may be a case where a noise (e.g., conduction noise) other than radiation noise is mixed into the control signal, but here, the "radiation noise" will be focused on and described. Now, an electrical system including the first switch unit 17a, the first drive unit 14a and the first power supply 18 is referred to as a first electrical system. An electric system including the second switch unit 17b, the second drive unit 14b and the first power supply 18 is named a second electric system. An electric system including the third switch unit 17c, the third drive unit 14c and the first power supply 18 is named a third electric system. An electric system including the fourth switch unit 17d, the fourth drive unit 14d and the first power supply 18 is named a fourth electric system. An electric system including the fifth switch unit 17e, the fifth drive unit 14e and the first power supply 18 is named a fifth electric system.

In order to resume the operation of the robot 20 which has been stopped, an operator OP needs to estimate which of the first to fifth electrical systems the radiation noise source is derived from, and take measures to suppress the radiation of the radiation noise (for example, by setting an electromagnetic shield) or to reduce the influence of the radiation noise (by changing the routing of cables, for example, the control cable 25, at least one drive cable 23, at least one power cable 21 etc.), with respect to the estimated electrical system.

For dealing with the above situation, the inventors of the present invention have developed the noise source monitoring apparatus 10 of the present embodiment in order to enable the operator OP to estimate the generation source of radiation noise.

Figure 2:
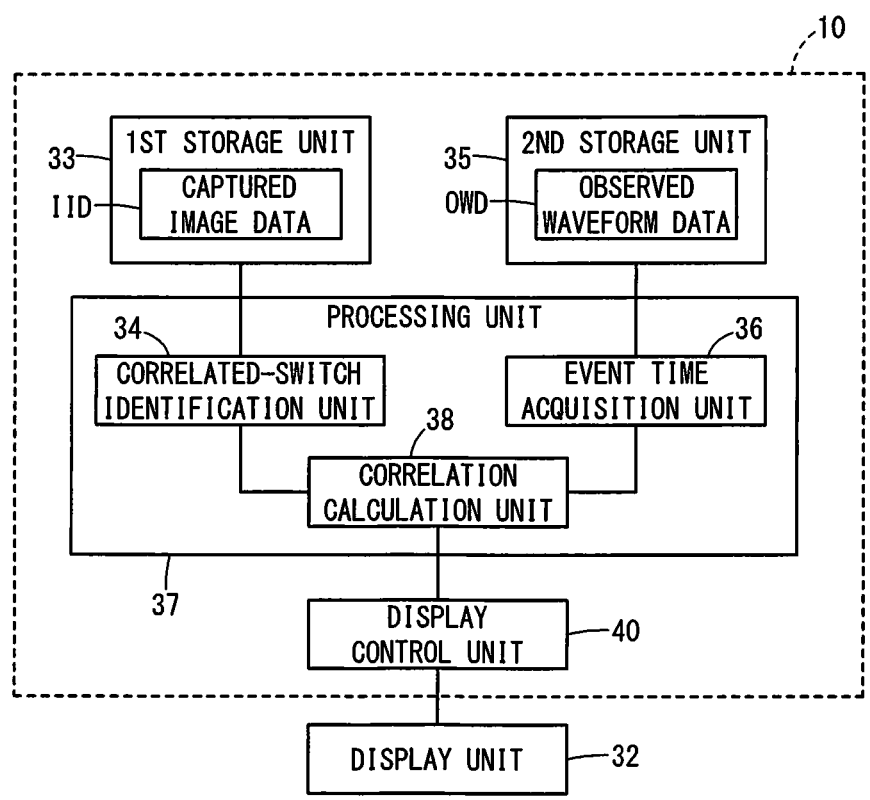
FIG. 2 is a control block diagram of a noise source monitoring apparatus according to an embodiment of the present invention.

As illustrated in FIG. 2, the noise source monitoring apparatus 10 includes a first storage unit 33, a second storage unit 35, a processing unit 37 and a display control unit 40. The processing unit 37 and the display control unit 40 are realized by, for example, a computer including a CPU (Central Processing Unit) and others.

The first storage unit 33 stores captured image data IID containing captured images of the multiple switch units 17 and capture times of the captured images (i.e., a point of time at which an image was captured). More specifically, the captured image data IID contains, for each frame, a captured image of the multiple switch units 17 taken by the camera 30 (see FIG. 1) and a capture time at which the image of the frame was captured, and the data IID is stored in the first storage unit 33. As the first storage unit 33, for example, a recording medium such as a non-volatile memory or a hard disk can be used.

Now, an acquisition method of the captured image data IID will be briefly described. First, the operator OP sets up the camera 30 on a holder HD such as a stand, a tripod or the like (see FIG. 1) so as to capture the operating states of the multiple levers 28 of the switchboard 16, that is, the operating states (the on/off switching states) of the multiple switch units 17. Next, the operator OP selects a video mode in the camera 30. When the video mode is selected, the camera 30 shoots a video (i.e., captures a moving image) of the multiple switch units 17. The data of the video obtained by this video shooting is the captured image data IID. The captured image data IID thus obtained is stored in the first storage unit 33 of the noise source monitoring apparatus 10 by wireless or wired communication. Alternatively, the operator OP may store the data into the first storage unit 33 via a storage medium such as a memory card.

When the door of the box housing the switchboard 16 is not transparent, the operator OP may open the door to expose the multiple switch units 17 so that the camera 30 can capture images of the multiple switch units 17. When the door of the box housing the switchboard 16 is transparent, the operator OP can capture images of the multiple switch units 17 by the camera 30 while keeping the door closed.

The second storage unit 35 stores observed waveform data OWD containing the waveform detected by an oscilloscope 26 (see FIG. 1) connected to the control device 22 together with observation time. More specifically, the voltage waveform of the control signal is observed by the oscilloscope 26 during the video shooting of the multiple switch units 17 by the camera 30, and the observed waveform data OWD having the observed waveform and the observation time is stored into the second storage unit 35. As the second storage unit 35, for example, a storage medium such as a non-volatile memory or a hard disk can be used. The observed waveform data OWD acquired by the oscilloscope 26 is also stored in the second storage unit 35 of the noise source monitoring apparatus 10 by wireless or wired communication. Alternatively, the operator OP may store the data into the second storage unit 35 via a storage medium such as a memory card.

That is, the captured image data IID and the observed waveform data OWD are generated in parallel in time. The generation time of the captured image data IID and that of the observation waveform data OWD do not necessarily need to completely coincide with each other. In short, the generation times only have to be at least partially overlapped with each other.

The processing unit 37, based on the captured image data IID and the observed waveform data OWD, calculates, for each switch unit 17, the degree of correlation between occurrence or event of radiation noise occurring in the control device 22 and operation of the switch unit 17. The processing unit 37 includes a correlated-switch identification unit (identification unit) 34, an event time acquisition unit 36 and a correlation calculation unit 38.

The event time acquisition unit 36 analyzes the observed waveform data OWD to thereby acquire the event time of a radiation noise generated in the control device 22 (hereinafter also referred to as "noise event time NT"). Specifically, the event time acquisition unit 36 reads the observed waveform data OWD from the second storage unit 35 to obtain the time at which the voltage waveform of the control signal is disturbed in the observed waveform data OWD (for example, a high frequency wave occurs on the voltage waveform) as the noise event time NT. The event time acquisition unit 36 sends the acquired noise event time NT to the correlated-switch identification unit 34. The event time acquisition unit 36 also transmits an acquisition signal to the correlation calculation unit 38 every time a noise event time NT is obtained.

The correlated-switch identification unit 34 analyzes the captured image data IID to thereby specify a switch unit 17 that was operated in each of multiple time periods (predetermined time periods) TZ, each including a different noise event time NT. Here, it is considered that the switch unit 17 that was operated within the range of the predetermined time period with reference to a noise event time NT has correlation with the occurrence of radiation noise. Therefore, the correlated-switch identification unit 34 reads the captured image data IID from the first storage unit 33, and compares the data of the multiple captured images taken in the multiple time periods TZ each containing a different noise event time NT, in the captured image data IID. Thereby, the correlated-switch identification unit 34 identifies the switch unit 17 that was operated in each of the multiple time periods TZ (i.e., whose operation time MT is contained in the time period TZ). The correlated-switch identification unit 34 sends, to the correlation calculation unit 38, information indicating the switch unit 17 identified in each time period TZ. The operation time MT of a switch unit 17 can be determined based on, for example, a time t1 at which an image was captured immediately before the start of the operation of the switch unit 17 and a time t2 at which an image was captured immediately after the end of the operation of the switch unit 17. The operation time MT can be defined as, for example, an intermediate time between t1 and t2.

The correlation calculation unit 38 calculates the degree of correlation such that, as the number of times a switch unit 17 was identified by the correlated-switch identification unit 34 (hereinafter also referred to as "the identified number of times") is greater, the degree of correlation for the switch unit 17 is higher. Specifically, the correlation calculation unit 38 determines the degree of correlation for each switch unit 17 by dividing the identified number of times of the switch unit 17 by the total number of receptions of acquisition signals (the count of acquired noise event times NT at the noise event time acquisition unit 36, which will be also referred to as "noise event time acquisition count").

Now, a specific example of the calculation method of the degree of correlation by the processing unit 37 will be described.

As an example, FIG. 3A shows a table of an identified result of switch units 17, wherein, when the event time acquisition unit 36 obtained ten noise event times NT, the correlated-switch identification unit 34 identified the switch unit 17 that was operated in each of multiple time periods TZ containing a different noise event time NT (i.e., the switch unit whose operation time MT is contained in a time period TZ). That is, FIG. 3A shows the presence or absence of the operation of the switch units 17 in the time periods TZ. FIG. 3B shows, on the time axis, ten noise event times NT, ten time periods TZ corresponding thereto, and the operation time MTni of the n-th switch unit 17 (n=1 to 5, i=a, b, c . . . ) in the k-th time period TZ (k is at least one of 1 to 10). Here, the ten time periods TZ include first time period TZ1, second time period TZ2, third time period TZ3, fourth time period TZ4, fifth time period TZ5, sixth time period TZ6, seventh time period TZ7, eighth time period TZ8, ninth time period TZ9 and tenth time period TZ10. Ten noise event times NT include noise event time NT1, noise event time NT2, noise event time NT3, noise event time NT4, noise event time NT5, noise event time NT6, noise event time NT7, noise event time NT8, noise event time NT9 and noise event time NT10. Here, the time length of each of the first time period TZ1 to the tenth time period TZ10 is constant (the same).

As can be seen from FIG. 3B, the first time period TZ1 contains none of operation times MT of switch units 17 (no switch units 17 operated). The second time period TZ2 contains an operation time MT2a of the second switch unit 17b (the second switch unit 17b operated). The third time period TZ3 contains an operation time MT5a of the fifth switch unit 17e (the fifth switch unit 17e operated). The fourth time period TZ4 contains an operation time MT2b of the second switch unit 17b (the second switch unit 17b operated). The fifth time period TZ5 contains an operation time MT5b of the fifth switch unit 17e (the fifth switch unit 17e operated). The sixth time period TZ6 contains an operation time MT1a of the first switch unit 17a (the first switch unit 17a operated). The seventh time period TZ7 contains an operation time MT5c of the fifth switch unit 17e (the fifth switch unit 17e operated). The eighth time period TZ8 contains an operation time MT5d of the fifth switch unit 17e (the fifth switch unit 17e operated). The ninth time period TZ9 contains an operation time MT2c of the second switch unit 17b (the second switch unit 17b operated). The tenth time period TZ10 contains an operation time MT5e of the fifth switch unit 17e (the fifth switch unit 17e operated).

In FIG. 3A, "present" indicates that an operation time MT of a switch unit 17 is contained in the time period TZ, that is, "the switch unit 17 was operated", and "none" indicates that no operation time MT of a switch unit 17 is contained in the time period TZ, that is, "the switch unit 17 was not operated". In FIG. 3A, the correlation calculation unit 38 calculates the ratio of the number of "present" to the number of time periods TZ (here, 10) for each switch unit 17, as the "correlation degree (degree of correlation)". For example, the degree of correlation of the first switch unit 17a is $^1/_{10}$, the degree of correlation of the second switch unit 17b is $^3/_{10}$, the degree of correlation of the third switch unit 17c is 0, the degree of correlation of the fourth switch unit 17d is 0, and the degree of correlation of the fifth switch unit 17e is $^1/_2$. Hereinbelow, the total number of "present" in each switch unit 17 in FIG. 3A is also referred to as "noise-correlated operation count". At this time, the "noise-correlated operation count/the number of times of noise event time acquisition" for each switch unit 17 indicates the "degree of correlation" for each switch unit 17. Here, the center of each time period TZ does not need to necessarily coincide with the noise event time NT, and may be offset from the noise event time NT. In addition, the calculation method of the correlation degree by the processing unit 37 is not limited to the above calculation method, and can be changed as appropriate.

The display control unit 40 causes a display unit 32 to display information indicating the degree of correlation calculated by the correlation calculation unit 38. Specifically, the display control unit 40 acquires the captured image data of the multiple switch units 17 from the captured image data IID and causes the display unit 32 to display the multiple switch units 17 and superimpose a color on at least one switch unit 17. At this time, the display control unit 40 changes the color to be superimposed on switch units 17 in accordance with the degree of correlation of each switch unit 17. For example, the display control unit 40 changes the color so that the switch unit 17 having a higher degree of correlation becomes more distinct (darker or gaudy color, see the partially enlarged extracted view of the display screen of the display unit 32 in FIG. 4). Here, "dark color" means "dark shade" in similar colors. The "gaudy color" means vivid colors, regardless of similar colors or different colors. For example, the display control unit 40 may superimpose similar colors (for example, dark red, light red, dark pink, light pink and the like) on the multiple switch units 17 in accordance with the degree of correlation. As another example, the display control unit 40 may superimpose different colors (for example, red, blue, yellow, green, black, etc.) having different hue on the multiple switch units 17 according to the degree of correlation.

Figure 4:
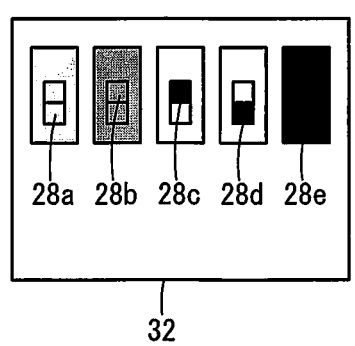
FIG. 4 is a partially enlarged view showing a display image on a display unit connected to a noise source monitoring apparatus.

In the case of FIG. 3A and FIG. 3B, by the display control unit 40, the fifth switch unit 17e having the highest degree of correlation is colored with the darkest or the gaudiest, the second switch unit 17b having the second highest degree of correlation is colored with the second darkest or the second gaudiest, and the first switch unit 17a having the third highest degree of correlation is colored with the third darkest or the third gaudiest (see the display image of the display unit 32 in FIG. 4). Here, the display control unit 40 does not superimpose any colors on the third switch unit 17c or the fourth switch unit 17d whose correlation degree is zero.
(Noise Source Monitoring Process 1)

Figure 5:
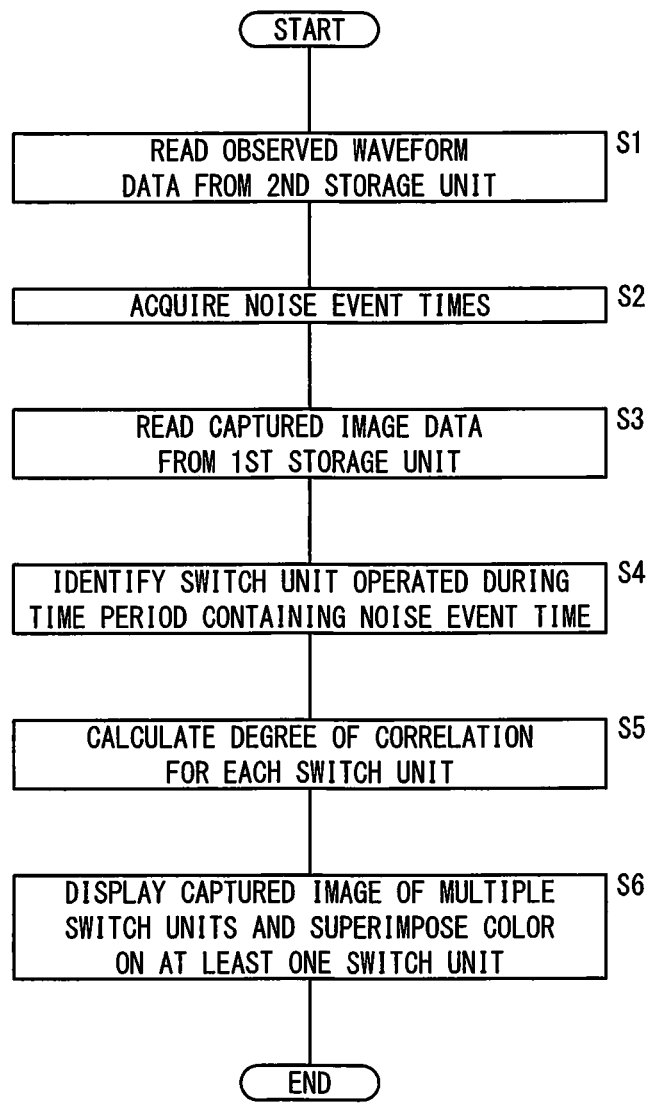
FIG. 5 is a flowchart showing a noise source monitoring process 1.

Referring next to the flowchart of FIG. 5, a noise source monitoring process 1 implemented by the noise source monitoring apparatus 10 will be described. Here, it is assumed that the captured image data IID and the observed waveform data OWD have been stored in the second storage unit 35 in advance before the start of the noise source monitoring process 1.

At the first step S1, the event time acquisition unit 36 reads the observed waveform data OWD from the second storage unit 35.

At the next step S2, the event time acquisition unit 36 analyzes the observed waveform data OWD to acquire noise event times NT.

At the next step S3, the correlated-switch identification unit 34 reads the captured image data IID from the first storage unit 33.

At the next step S4, the correlated-switch identification unit 34 analyzes the captured image data IID to specify a switch unit 17 operated during each of multiple time periods TZ containing respective noise event times NT different from each other.

At the next step S5, the correlation calculation unit 38 calculates the correlation degree for each switch unit 17.

At the next step S6, the display control unit 40 causes the captured image of the multiple switch units 17 to be displayed with a color being superimposed on at least one switch unit 17.
[Modifications]

The configuration of the noise source monitoring apparatus 10 described in the above embodiment can be changed as appropriate.
(Modification 1)

In the above embodiment, the first storage unit 33 and the second storage unit 35 are two different storage media, but may be two different storage areas of one storage medium.
(Modification 2)

By the way, it is considered that the switch unit 17 whose operation time MT is contained within the range of a predetermined time period with reference to a noise event time NT has a correlation with the occurrence of radiation noise. Therefore, the correlated-switch identification unit 34 analyzes the captured image data IID to obtain operation times MT of each of the multiple switch units 17 (times at which the switch was switched on or off), determines whether the operation time MT of each switch unit 17 is contained in each of the multiple time periods TZ each including a noise event time NT different from others, and sends the determined result to the correlation calculation unit 38. Then, the correlation calculation unit 38 may calculate the degree of correlation such that, as the number of times the operation time MT for a switch unit 17 was determined to be contained in the time periods is greater, the degree of correlation of the switch unit 17 is higher. The correlated-switch identification unit 34 can obtain the operation time MT of each switch unit 17 by comparing the data of the captured image, frame by frame, in the captured image data IID.
(Noise Source Monitoring Process 2)

Figure 6:
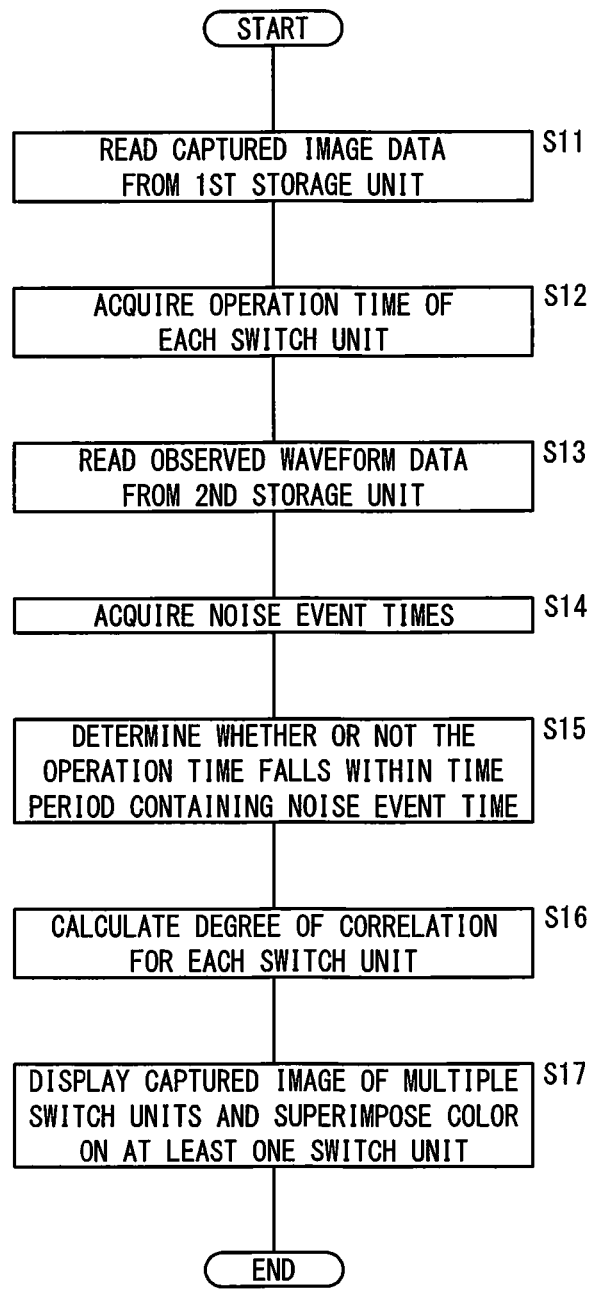
FIG. 6 is a flowchart showing a noise source monitoring process 2.

A noise source monitoring process 2 (noise source monitoring process of Modification 2) performed by the noise source monitoring apparatus 10 will be described with reference to the flowchart of FIG. 6. Here, it is assumed that the captured image data IID has been stored in the first storage unit 33 and the observed waveform data OWD has been stored in the second storage unit 35, in advance before the start of the noise source monitoring process 2.

At the first step S11, the correlated-switch identification unit 34 reads the captured image data IID from the first storage unit 33.

At the next step S12, the correlated-switch identification unit 34 analyzes the captured image data IID to acquire the operation time MT of each switch unit 17.

At the next step S13, the event time acquisition unit 36 reads the observed waveform data OWD from the second storage unit 35.

At the next step S14, the event time acquisition unit 36 acquires noise event times NT and sends them to the correlated-switch identification unit 34.

At the next step S15, the correlated-switch identification unit 34 determines, for each switch unit, whether the operation time MT falls within each of multiple time periods TZ each including a different noise event time NT. The determination result is sent to the correlation calculation unit 38.

At the next step S16, the correlation calculation unit 38 calculates the degree of correlation for each switch unit 17.

At the next step S17, the display control unit 40 causes the captured image of the multiple switch units 17 to be displayed with a color being superimposed on at least one switch unit 17.
(Modification 3)

Figure 7:
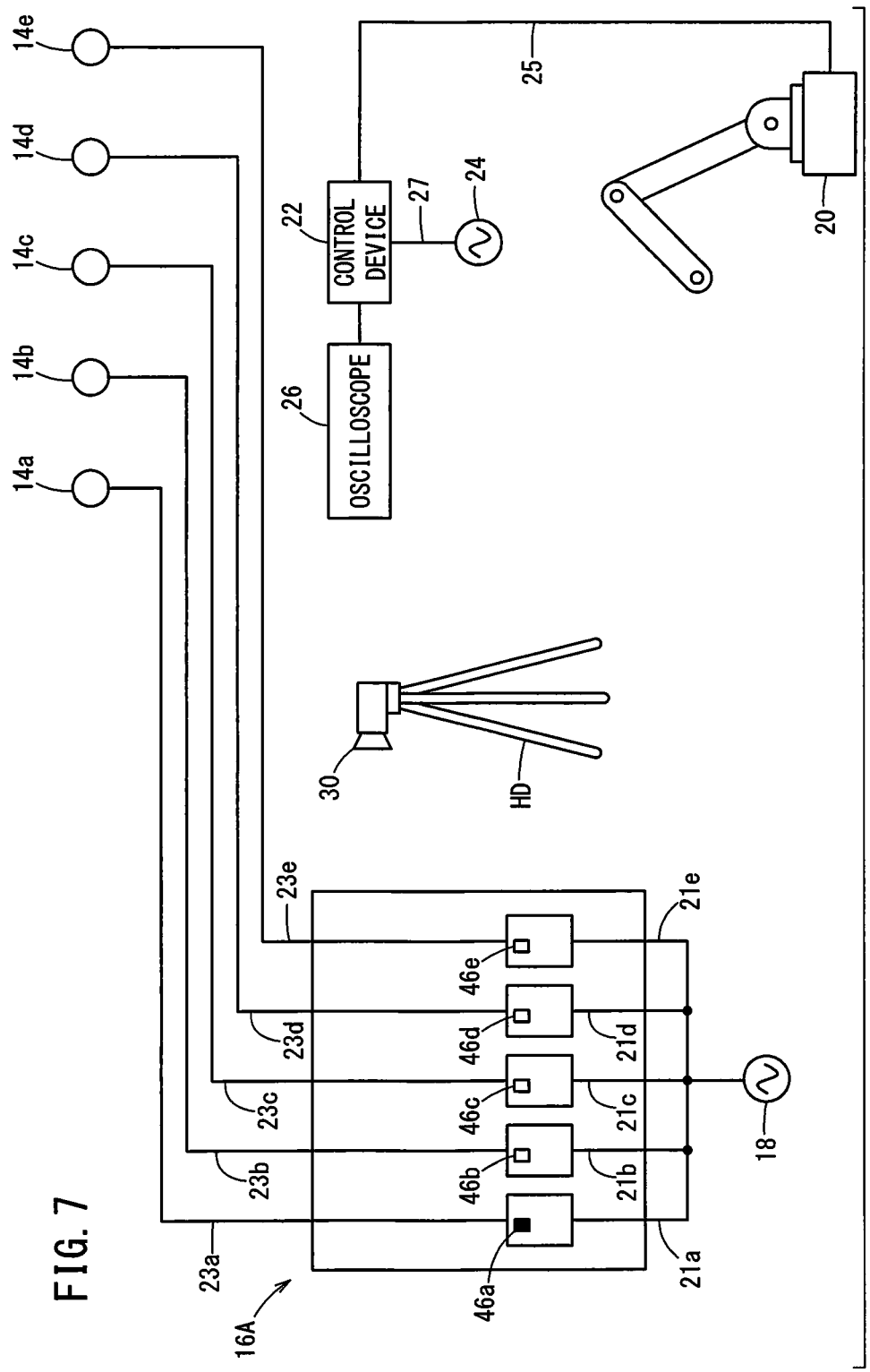
FIG. 7 is a diagram showing a configuration example of a switchboard of Modification 3.
Figure 8:
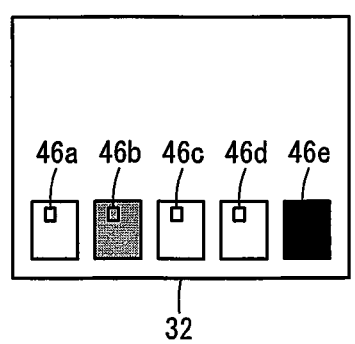
FIG. 8 is a partially enlarged view showing a display image on a display unit connected to a noise source monitoring apparatus.

As in a switchboard 16A in Modification 3 shown in FIG. 7, instead of the multiple (e.g., five) levers 28, multiple (e.g., five) light sources 46 (a first light source 46a for the first switch unit, a second light source 46b for the second switch unit, a third light source 46c for the third switch unit, a fourth light source 46d for the fourth switch unit, a fifth light source 46e for the fifth switch unit) which switch between an ON state and an OFF state in accordance with the on/off state of the associated switch, may be used. Here, when a switch unit is on, the light source 46 associated with the switch unit is lit (the lit light source 46 is illustrated with an outline (white) on the switchboard 16A in FIG. 7), whereas when a switch unit is off, the light source 46 associated with the switch unit is turned off (the turned-off light source 46 is illustrated with a solid (black) on the switchboard 16A in FIG. 7). In this case, the correlated-switch identification unit 34 analyzes the captured image data IID, and recognizes the on/off state of each light source 46 to thereby recognize the operation of the switch unit including the light source 46. The display control unit 40 displays the captured image of the multiple (for example, five) light sources 46 and superimposes a color on at least one of the switch units. Specifically, for example, the display control unit 40 superimposes the most distinct color (the darkest color or the gaudiest color) on the fifth switch unit having the highest degree of correlation, superimposes the second-most distinct color (the second darkest or the second gaudiest) on the second switch unit having the second highest degree of correlation, and superimposes the third-most distinct color (the third darkest or the third gaudiest) on the first switch unit having the third highest degree of correlation (see the partially enlarged extracted view of the display unit 32 in FIG. 8). The display control unit 40 does not superimpose colors on the third switch unit or the fourth switch unit whose correlation degree is zero. For each light source 46, an LED (light emitting diode) may be used, for example.

(Modification 4)

In the switchboard, a plurality of sets (for example, 5 sets) of levers 28 and light sources may be used, wherein, in each set, the lever and the light source are simultaneously switched on/off in synchronization with the on/off switching of the corresponding switch. Specifically, when a switch is on, the lever 28 corresponding to the switch is turned on, and the light source corresponding to the switch is lit, and when a switch is off, the lever 28 corresponding to the switch is turned off, and the light source corresponding to the switch is turned off. The display control unit 40 displays the captured image of the multiple (e.g., five) levers 28 and the multiple (e.g., five) light sources, and superimposes a color on at least one of the switch units. The color superimposing method is the same as that of the above embodiment and Modifications. As an example of the light source, an LED (light emitting diode) may be used.

(Modification 5)

It goes without saying that the number of switch units 17 in the switchboard 16 can be changed as appropriate according to the number of drive units 14 used.

(Modification 6)

Although the robot 20 is used as an industrial machine in the above embodiment and Modifications, the present invention should not be limited to this. For example, any other industrial machines, such as a cutting machine, a press machine, a wire electrical discharge machine, an injection molding machine, a machine tool that machines a workpiece using a tool, and the like may be used as long as they are an industrial machine controlled by the control device 22.

(Modification 7)

In the above embodiment and Modifications, the display control unit 40 does not superimpose any color on switch units 17 corresponding to switches with a correlation degree of 0, but may superimpose an inconspicuous color (for example, white) on them.

(Modification 8)

Although, in the above embodiment and Modifications, multiple colors (including achromatic colors) are used as the information indicating the degree of correlation, the present invention should not be limited to this. As the information indicating the degree of correlation, for example, multiple words such as "highest", "high", "medium", "low", and "lowest", multiple figures such as "1", "2", "3", "4", and "5", or multiple letters such as "A", "B", "C", "D" and "E" may be used. Further, the information indicating the degree of correlation may be the numerical value itself.

(Modification 9)

In the above embodiment and Modifications, at least one of the lever 28 and the light source 46 which are switched on/off in conjunction with the operation of the switch is used. However, for example, it is possible to use a button that moves between a projected position and a non-projected position (e.g., a retracted position). In this case, it is necessary to take the image with the camera 30 from one side (for example, the upper side, the lower side, the right side, the left side, etc. of the button) that makes it possible to determine the distinguish between the projected position and the non-projected position of the button. In this case, the correlated-switch identification unit 34 analyzes the captured image data IID and recognizes switching of projection/non-projection of each button to thereby recognize the operation of the switch unit containing the button.

(Modification 10)

In the above embodiment and Modifications, the oscilloscope 26 observes the control signal while the event time acquisition unit 36 detect a time at which a disturbance occurs in the control signal, as a noise event time NT. However, the invention should not be limited to this. For example, the oscilloscope 26 may be adapted to observe the reference potential of the control device 22 while the event time acquisition unit 36 may detect a time at which a disturbance occurs in the reference potential, as a noise event time NT.

(Modification 11)

The event time acquisition unit 36 may be configured to obtain the magnitude of a radiation noise by analyzing the observed waveform data OWD, and the correlation calculation unit 38 may calculate the degree of correlation between occurrence of a radiation noise whose magnitude exceeds a threshold and the operation of the switch unit. In this case, it is possible to omit radiation noises that will not affect the control signal or the reference potential, from the targets of correlation calculation. The threshold is variable, and the correlation calculation unit 38 may calculate the degree of correlation between the occurrence of a radiation noise exceeding the threshold selected by the operator OP and the operation of the switch unit. This configuration makes it possible to improve flexibility in calculation of the degree of correlation by the correlation calculation unit 38. Here, if the threshold is set too low, the degree of correlation for a switch unit correlated with a radiation noise that would have little influence over the control signal tends to be calculated to be higher. On the other hand, if the threshold is set too high, the degree of correlation for a switch unit correlated with a radiation noise that would affect the control signal tends to be calculated to be lower.

(Modification 12)

In the above embodiment and Modifications, the correlation calculation unit 38 calculates the degree of correlation such that, as the number of times a switch unit was identified by the correlated-switch identification unit 34 (which will be also referred to as "the identification count") is greater, the degree of correlation for the switch unit is higher. However, the present invention should not be limited to this. For example, the correlation calculation unit 38 may calculate the degree of correlation such that, as the ratio of the identification count to the number of operations (the number of operations during the noise source monitoring process 1 or 2) for a switch unit is greater, the degree of correlation for the switch unit is higher. In this case, the correlated-switch identification unit 34 needs to count the number of operations of each switch unit when the captured image data IID is analyzed, and send the count (the number of operations) to the correlation calculation unit 38. In the above-described embodiment and Modifications, if there are multiple switch units having the same identification count but having the numbers of operations different from each other, the correlation degrees of the multiple switch units take the same value. For example, suppose that there occurred radiation noises five times and that the switch unit A was operated 10 times and was identified once while the switch unit B was operated 20 times and identified once. In this case, the degrees of correlation for the switch units A and B both result in 1/5. However, in this Modification, because the degree of correlation is defined as the identification count/the number of operations, the degree of correlation for the switch unit A results in 1/10, whereas the degree of correlation for the switch unit B results in 1/20. That is, in this Modification, the number of operations can be reflected on the degree of correlation.

(Modification 13)

In the above embodiment and Modifications, each drive unit 14 and the first power supply 18 are appropriately connected via a switch unit associated to the drive unit 14. However, each drive unit 14 and an element or a group of elements connected to the first power supply 18 may be appropriately connected via a switch unit associated to the drive unit 14.

(Modification 14)

In the above embodiment and Modifications, the correlated-switch identification unit 34 identifies a switch unit 17 which was operated in each of multiple time periods TZ containing respective noise event times NT different from each other. However, the invention should not be limited to this. The point is that the correlated-switch identification unit 34 may and should detect a pair of a noise event time NT and an operation time MT of a switch unit 17 within a predetermined time range. For example, the pair may be detected by determining whether or not a noise event is taking place in each of multiple predetermined time periods each including a different operation time MT of each switch unit 17, for the multiple operation times MT of switch units 17. Alternately, the pair may be detected by determining whether or not a noise event time NT is contained in each of multiple predetermined time periods each including a different operation time MT of each switch unit 17, for the multiple operation times MT of switch units 17. In these cases, the event time acquisition unit 36 is not essential.

(Modification 15)

Figure 9:
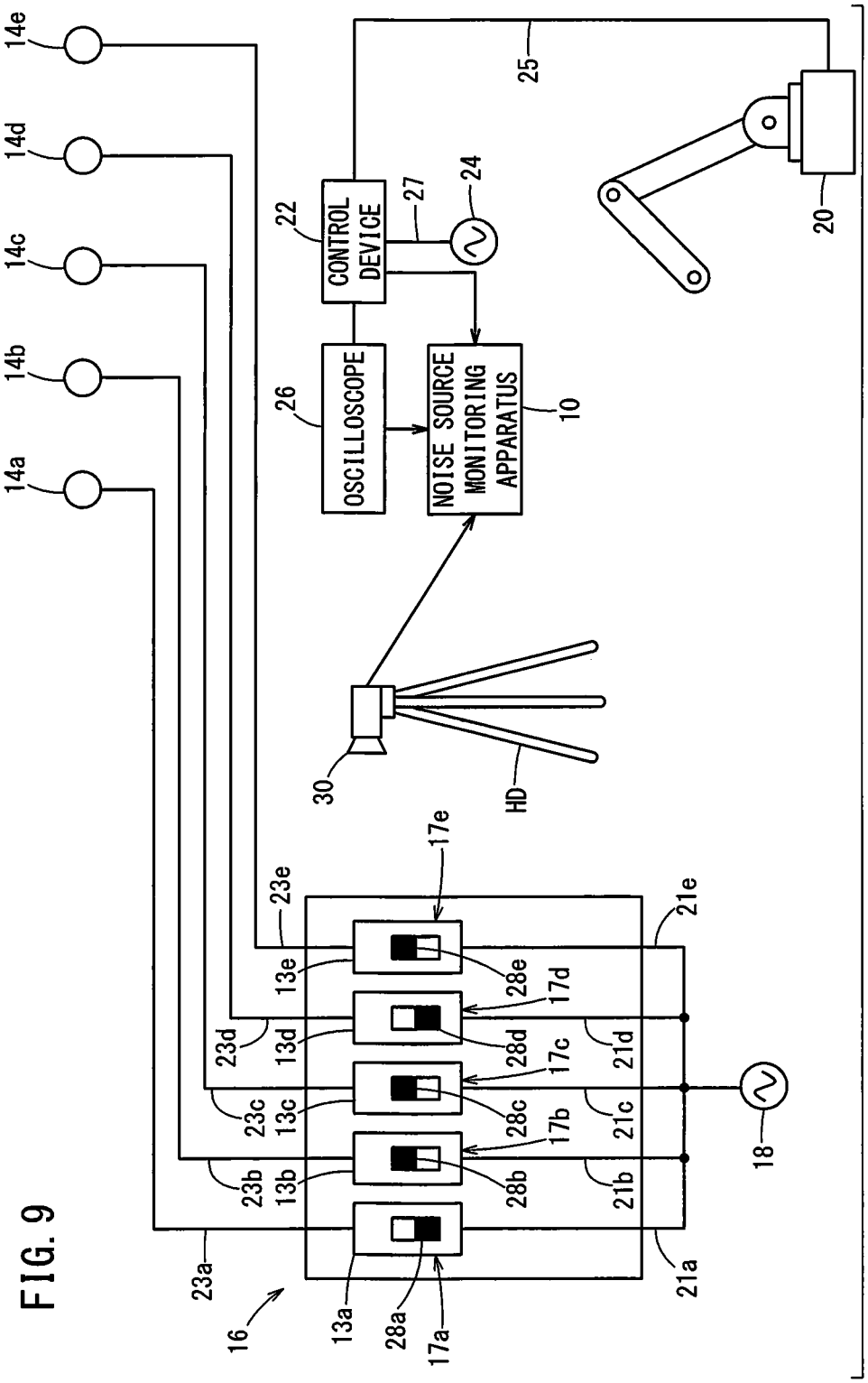
FIG. 9 is a diagram showing a schematic configuration of a noise source monitoring apparatus and others according to Modification 15.

Though, in the above embodiment and Modifications, the noise source is assumed to be other than the robot 20, the operation of the robot 20 may sometimes become a noise source on the control signal of the robot 20. FIG. 9 is a diagram showing a schematic configuration of a noise source monitoring apparatus 10 according to Modification 15. In FIG. 9, the noise source monitoring apparatus 10 is added to the configuration of FIG. 1. The noise source monitoring apparatus 10 is connected to the camera 30, the oscilloscope 26 and the control device 22 so as to able to obtain information from each of them. The noise source monitoring apparatus 10 acquires operation information of the robot 20 from the control device 22. The operation information of the robot 20 is time-sequential data representing what kind of motion the robot 20 is making. Specific examples of the operation information of the robot 20 include the positions of all the movable joints that specify the posture and position of the robot 20 at each point of time, the execution portions in the control program of the robot 20 executed by the control device 22 at each point of time, and others. The correlation calculation unit 38 of the noise source monitoring apparatus 10, based on the event time of a radiation noise (noise event time NT) and the operation information of the robot 20, calculates a degree of correlation between the event of the radiation noise and the operation of the robot 20. The display control unit 40 causes the display unit 32 to display the information indicating the calculated degree of correlation on a screen (not shown) following the screen displayed in FIG. 4.

(Modification 16)

Modifications 1 to 15 may be arbitrarily combined as long as no technical inconsistency occurs.

Inventions that can be Grasped from the Embodiment and Modifications 1 to 16

[First Invention]

According to a first invention, the noise source monitoring apparatus (10) includes: a first storage unit (33) configured to store captured image data (IID) containing a captured image of a plurality of switch units (17) and a capture time of the captured image, the switch units (17) being configured to switch on and off drive units (14) for driving a plurality of devices, the drive units being arranged around a control device (22) for controlling an industrial machine (20), the plurality of devices being different from the industrial machine (20); a second storage unit (35) configured to store observed waveform data (OWD) containing an observed waveform displayed on an oscilloscope (26) connected to the control device (22) and an observation time of the observed waveform; a processing unit (37) configured to calculate, for each of the switch units (17), the degree of correlation between occurrence of a noise generated in the control device (22) and operation of the switch unit (17), based on the captured image data (IID) and the observed waveform data (OWD); and a display control unit (40) configured to cause a display unit (32) to display information indicating the degree of correlation.

As a result, information indicating the degree of correlation between occurrence of a noise and operation of each switch unit (17) is displayed on the display unit (32).

That is, according to the first invention, it is possible to provide the operator (OP) with information for estimating the noise source of noise generated in the control device (22) that controls the industrial machine (20).

The processing unit (37) may include: an event time acquisition unit (36) configured to analyze the observed waveform data (OWD) and acquire a noise event time (NT) of a noise generated in the control device (22); an identification unit (34) configured to analyze the captured image data (IID) and identify one of the switch units (17) that has operated in each of a plurality of predetermined time periods (TZ) containing the respective noise event times (NT) which are different from each other; and a correlation calculation unit (38) configured to calculate the degree of correlation of each of the plurality of switch units (17) so that, as the number of times the switch unit (17) has been identified by the identification unit (34) is greater, the degree of correlation for the switch unit (17) is higher. As a result, even if there is a time lag between the noise event time (NT) and the operation time (MT) of the switch unit (17), it is possible to prevent occurrence of misjudgment that there is no correlation of the switch unit (17) with the generation of the noise.

The identification unit (34) may be configured to analyze the captured image data (IID), acquire operation times (MT) of the plurality of switch units (17), and identify one of the switch units (17) that has operated in each of the plural predetermined time periods (TZ), based on the operation times (MT) and the noise event times (NT).

The correlation calculation unit (38) may be configured to calculate the degree of correlation so that, as the number of times the switch unit (17) has been identified by the identification unit (34) is greater, the degree of correlation for the switch unit (17) is higher. Thereby, the relative degrees of correlation of multiple switch parts (17) can be calculated.

The correlation calculation unit (38) may be configured to calculate the degrees of correlation so that, as the ratio of the number of times the switch unit (17) has been identified by the identification unit (34), to the number of operations of the switch unit is greater, the degree of correlation for the switch unit (17) is higher. Thereby, the correlation calculation unit (38) can reflect the number of operations of each switch unit (17) on the correlation degree of the switch unit (17).

The event time acquisition unit (36) may be configured to analyze the observed waveform data (OWD) and acquire the magnitude of the noise, and the correlation calculation unit (38) may calculate the degree of correlation between occurrence of the noise whose magnitude exceeds a threshold, and the operation of the switch unit (17). Thereby, the correlation calculation unit (38) can omit noises of a level that will not affect the control of the industrial machine (20) by the control device (22), when performing the correlation calculation.

The threshold may be variable, and the correlation calculation unit (38) may be configured to calculate the degree of correlation between occurrence of the noise whose magnitude exceeds a threshold selected by an operator (OP), and operation of the switch unit (17). This configuration makes it possible to improve flexibility in calculation of the degree of correlation by the degree of correlation calculation unit (38).

The display control unit (40) may be configured to display the captured image of the plural switch units (17) and superimpose information indicating the degree of correlation on at least one of the switch units (17). This configuration enables the operator (OP) to easily recognize the degree of correlation for each switch unit (17) by viewing the displayed image.

The information indicating the degree of correlation may be represented by a color, and the display control unit (40) may be configured to change the color in accordance with the degree of correlation. As a result, the operator (OP) can clearly grasp the level of the degree of correlation for each switch unit (17).

[Second Invention]

According to a second invention, a noise source monitoring method includes: a step of reading captured image data (IID) from a first storage unit (33) storing the captured image data (IID), the captured image data containing a captured image of a plurality of switch units (17) and a capture time of the captured image, the switch units (17) being configured to switch on and off drive units (14) for driving a plurality of devices, the drive units being arranged around a control device (22) for controlling an industrial machine (20), the plurality of devices being different from the industrial machine (20); a step of reading observed waveform data (OWD) from a second storage unit (35) storing the observed waveform data (OWD), the observed waveform data containing an observed waveform displayed on an oscilloscope (26) connected to the control device (22) and an observation time of the observed waveform; a correlation calculating step of calculating, for each of the switch units (17), the degree of correlation between occurrence of a noise generated in the control device (22) and operation of the switch unit (17), based on the captured image data (IID) and the observed waveform data (OWD); and a display controlling step of causing a display unit (32) to display information indicating the degree of correlation.

As a result, information indicating the degree of correlation between the occurrence of noise and the on/off switching of each switch unit (17) is displayed on the display unit (32).

That is, according to the second invention, it is possible to provide the operator (OP) with information for estimating the noise source of noise generated in the control device (22) that controls the industrial machine (20).

The correlation calculating step may include: an event time acquiring step of analyzing the observed waveform data (OWD) and acquiring a noise event time (NT) of a noise generated in the control device (22); an identifying step of analyzing the captured image data (IID) and identify one of the switch units (17) that has operated in each of a plurality of predetermined time periods (TZ) containing the respective noise event times (NT) which are different from each other; and a calculation step of calculating the degree of correlation of each of the switch units (17) so that, as the number of times the switch unit (17) has been identified at the identifying step is greater, the degree of correlation for the switch unit (17) is higher. As a result, even if there is a time lag between the noise event time (NT) and the operation time (MT) of the switch unit (17), it is possible to prevent occurrence of misjudgment that there is no correlation of the switch unit (17) with the generation of the noise.

The event time acquiring step may analyze the observed waveform data (OWD) to acquire the magnitude of noise, and the calculation step may calculate the degree of correlation between occurrence of the noise whose magnitude exceeds a threshold, and the operation of the switch unit (17). Thereby, in the calculation step, it is possible to omit noises of a level that will not affect control of the industrial machine (20) by the control device (22), from among the noises, when performing correlation calculation.

The threshold may be variable and the calculation step may be configured to calculate the degree of correlation between occurrence of the noise whose magnitude exceeds a threshold selected by an operator (OP), and operation of the switch unit (17). This configuration makes it possible to improve flexibility in calculation of the degree of correlation at the calculation step.

The display controlling step may be configured to display the captured image of the plural switch units (17) and superimpose information indicating the degree of correlation on at least one of the switch units (17). This configuration enables the operator (OP) to easily recognize the degree of correlation for each switch unit (17) by viewing the displayed image.

The information indicating the degree of correlation may represented by a color, and the display controlling step may be configured to change the color in accordance with the degree of correlation. As a result, the operator (OP) can clearly see the level of the degree of correlation for each switch unit (17).

The present invention is not particularly limited to the embodiment described above, and various modifications are possible without departing from the essence and gist of the present invention.

What is claimed is:

1. A noise source monitoring apparatus, comprising:
   a first storage unit configured to store captured image data containing a captured image of a plurality of switch units and a capture time of the captured image, the switch units being configured to switch on and off drive units for driving a plurality of devices, the drive units being arranged around a control device for controlling an industrial machine, the plurality of devices being different from the industrial machine;
   a second storage unit configured to store observed waveform data containing an observed waveform displayed on an oscilloscope connected to the control device and an observation time of the observed waveform;
   a processing unit configured to calculate, for each of the switch units, a degree of correlation between occurrence of a noise generated in the control device and operation of the switch unit, based on the captured image data and the observed waveform data; and
   a display control unit configured to cause a display unit to display information indicating the degree of correlation.

2. The noise source monitoring apparatus according to claim 1, wherein the processing unit includes:

an event time acquisition unit configured to analyze the observed waveform data and acquire a noise event time of a noise generated in the control device;

an identification unit configured to analyze the captured image data and identify one of the switch units that has operated in each of a plurality of predetermined time periods containing the respective noise event times which are different from each other; and a correlation calculation unit configured to calculate the degree of correlation of each of the switch units so that, as number of times the switch unit has been identified by the identification unit is greater, the degree of correlation for the switch unit is higher.

3. The noise source monitoring apparatus according to claim 2, wherein the identification unit is configured to analyze the captured image data, acquire operation times of the plurality of switch units, and identify one of the switch units that has operated in each of the plural predetermined time periods, based on the operation times and the noise event times.

4. The noise source monitoring apparatus according to claim 2, wherein the correlation calculation unit is configured to calculate the degree of correlation so that, as the number of times the switch unit has been identified by the identification unit is greater, the degree of correlation for the switch unit is higher.

5. The noise source monitoring apparatus according to claim 2, wherein the correlation calculation unit is configured to calculate the degree of correlation so that, as a ratio of the number of times the switch unit has been identified by the identification unit, to number of operations of the switch unit is greater, the degree of correlation for the switch unit is higher.

6. The noise source monitoring apparatus according to claim 2, wherein:

the event time acquisition unit is configured to analyze the observed waveform data and acquire magnitude of the noise; and the correlation calculation unit is configured to calculate the degree of correlation between occurrence of the noise whose magnitude exceeds a threshold, and operation of the switch unit.

7. The noise source monitoring apparatus according to claim 6, wherein:

the threshold is variable; and the correlation calculation unit is configured to calculate the degree of correlation between occurrence of the noise whose magnitude exceeds a threshold selected by an operator, and operation of the switch unit.

8. The noise source monitoring apparatus according to claim 1, wherein the display control unit is configured to display the captured image of the plurality of switch units and superimpose information indicating the degree of correlation on at least one of the switch units.

9. The noise source monitoring apparatus according to claim 8, wherein: the information indicating the degree of correlation is represented by a color; and the display control unit is configured to change the color in accordance with the degree of correlation.

10. A noise source monitoring method, comprising:

a step of reading captured image data from a first storage unit storing the captured image data, the captured image data containing a captured image of a plurality of switch units and a capture time of the captured image, the switch units being configured to switch on and off drive units for driving a plurality of devices, the drive units being arranged around a control device for controlling an industrial machine, the plurality of devices being different from the industrial machine;

a step of reading observed waveform data from a second storage unit storing the observed waveform data, the observed waveform data containing an observed waveform displayed on an oscilloscope connected to the control device and an observation time of the observed waveform;

a correlation calculating step of calculating, for each of the switch units, a degree of correlation between occurrence of a noise generated in the control device and operation of the switch unit, based on the captured image data and the observed waveform data; and a display controlling step of causing a display unit to display information indicating the degree of correlation.

11. The noise source monitoring method according to claim 10, wherein the correlation calculating step includes:

an event time acquiring step of analyzing the observed waveform data and acquiring a noise event time of a noise generated in the control device;

an identifying step of analyzing the captured image data and identifying one of the switch units that has operated in each of a plurality of predetermined time periods containing the respective noise event times which are different from each other; and a calculation step of calculating the degree of correlation of each of the switch units so that, as number of times the switch unit has been identified at the identifying step is greater, the degree of correlation for the switch unit is higher.

12. The noise source monitoring method according to claim 11, wherein:

the event time acquiring step is configured to analyze the observed waveform data to acquire magnitude of the noise; and the calculation step is configured to calculate the degree of correlation between occurrence of the noise whose magnitude exceeds a threshold, and operation of the switch unit.

13. The noise source monitoring method according to claim 12, wherein:

the threshold is variable; and the calculation step is configured to calculate the degree of correlation between occurrence of the noise whose magnitude exceeds a threshold selected by an operator, and operation of the switch unit.

14. The noise source monitoring method according to claim 10, wherein the display controlling step is configured to display the captured image of the plurality of switch units and superimpose information indicating the degree of correlation on at least one of the switch units.

15. The noise source monitoring method according to claim 14, wherein: the information indicating the degree of correlation is represented by a color; and the display controlling step is configured to change the color in accordance with the degree of correlation.

* * * * *